US006857518B2

(12) United States Patent
Chao (10) Patent No.: US 6,857,518 B2
(45) Date of Patent: Feb. 22, 2005

(54) CONTAINERS WITH ADDITIONAL FUNCTIONALITY

(75) Inventor: David Chao, Los Altos, CA (US)

(73) Assignee: Contour Optik INC, Chiayi (CN)

( * ) Notice: Subject to any disclaimer, the term of this patent is extended or adjusted under 35 U.S.C. 154(b) by 0 days.

(21) Appl. No.: 10/002,253

(22) Filed: Nov. 2, 2001

(65) Prior Publication Data

US 2004/0217021 A1 Nov. 4, 2004

(51) Int. Cl.⁷ .............................................. A45C 11/04
(52) U.S. Cl. .............................. 206/5; 206/38; 206/305; 206/320
(58) Field of Search .............................. 206/5, 6, 320, 206/223, 576, 579, 224, 38; D18/2

(56) References Cited

U.S. PATENT DOCUMENTS

| | | | | |
|---|---|---|---|---|
| 2,479,472 A | * | 8/1949 | Coplon | 206/37 |
| 3,323,638 A | * | 6/1967 | Dishart | 132/75 |
| 4,140,140 A | | 2/1979 | Proia et al. | |
| 4,230,224 A | | 10/1980 | Weeks | |
| 4,384,645 A | | 5/1983 | Manfredi | |
| 5,115,893 A | * | 5/1992 | Terkildsen | 190/11 |
| 5,605,226 A | | 2/1997 | Hernlein | |
| D382,009 S | * | 8/1997 | Miller, Jr. | D18/2 |
| 5,706,975 A | | 1/1998 | Cronk | |
| D410,672 S | * | 6/1999 | Chu | D18/2 |
| 5,918,734 A | | 7/1999 | Devens et al. | |
| 5,929,967 A | | 7/1999 | Conner | |
| 6,145,986 A | | 11/2000 | Conner | |
| 6,170,108 B1 | | 1/2001 | Knight | |
| 6,179,025 B1 | * | 1/2001 | Sutton | 150/105 |
| 6,244,400 B1 | * | 6/2001 | Bowers | 190/110 |
| 6,247,477 B1 | | 6/2001 | Wagner | |
| 6,357,641 B1 | | 3/2002 | Cheng | |
| 6,463,936 B1 | | 10/2002 | Hicks | |

FOREIGN PATENT DOCUMENTS

GB          1593152 A   *   7/1981   ........... A45C/11/34

* cited by examiner

*Primary Examiner*—Jila M. Mohandesi
(74) *Attorney, Agent, or Firm*—Greenberg Traurig, LLP

(57) ABSTRACT

The present invention is directed to multipurpose containers in which a variety of items can be stored, such as eyeglasses writing instruments, pills, medicines, thermometers, rulers, note pads, to name a few of the nearly limitless number of items that can be stored. The containers may be provided with writing implements or gauges to measure a parameter, such as a timepiece.

2 Claims, 8 Drawing Sheets

CONTAINERS WITH ADDITIONAL FUNCTIONALITY

FIELD OF THE INVENTION

The present invention is directed to multipurpose containers in which a variety of items can be stored, such as eyeglasses writing instruments, pills, medicines, thermometers, rulers, note pads, to name a few of the nearly limitless number of items that can be stored. The containers may be provided with an item of additional functionality, such as a massage element, a fan, a calculator, personal digital assistant, a radio, an MP3 player, to name a few possibilities.

BACKGROUND OF THE INVENTION

There are numerous containers in the prior art that can be used to store items, that may or may not have another purpose associated with it, such as an attached writing instrument, or storing another item, or providing information on a prevailing aspect of the moment, such as temperature or time.

SUMMARY OF THE INVENTION

The present invention is directed to multipurpose containers and that can be used to store and retain a variety of items, including such items as eyeglasses, medicines, foods, rulers, thermometers, note pads, to name but a few of the possibilities. The containers have an interior space for storing an item, and may be provided with a second interior space for storing a second item, The container may be provided with a writing implement, or it may be provided with a gauge for measuring a parameter. In onenon limiting embodiment, the invention is a pair of folding eyeglasses that is transformable into its own compact case.

While the detailed description relates to a container for eyeglasses, it is immediately apparent that other items can be stored in the containers as well.

DETAILED DESCRIPTION OF THE PREFERRED EMBODIMENT

Figure 1:
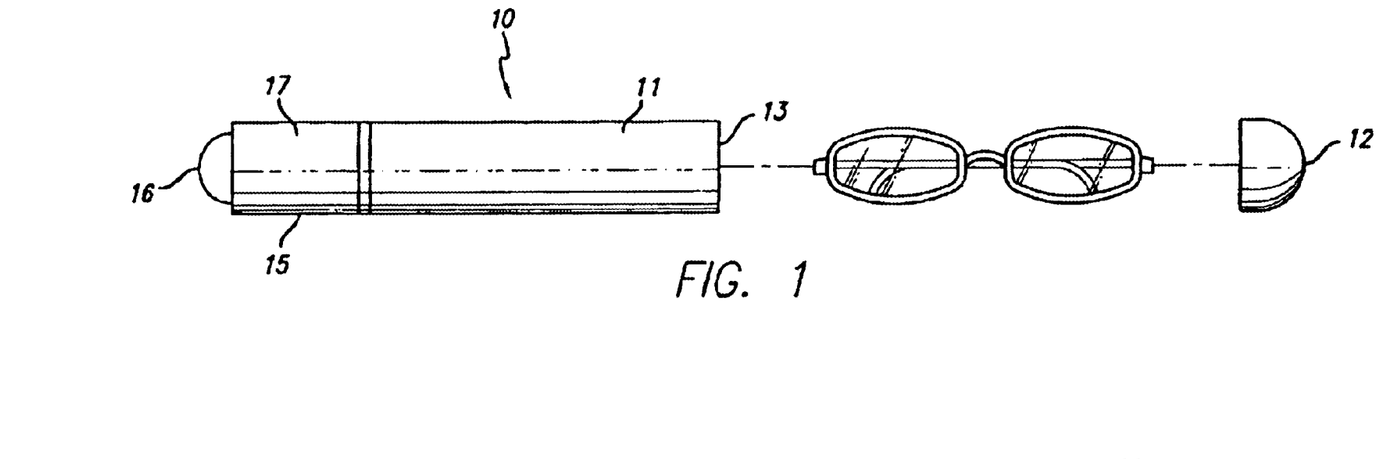
FIG. 1 is a side elevational view of a container provided with a massage element.

FIG. 1 shows a container 10 for storing eyeglasses or other items. The container 10 is provided with a body 11 defining a cavity in which an item such as eyeglasses can be stored. The container is provided with a cap 12 dimensioned to close the opening 13 of the body 11, through which opening 13 the eyeglasses are inserted into the cavity. When the cap 12 is joined to the body 11, the interior space is enclosed. When the cap is removed from the body, the interior space can be accessed, permitting the user to insert or remove the eyeglasses from the space.

The container is further provided with a massage element 15 at its other end. The massage element has a spherical tip suited to providing a pleasing or therapeutic effect to parts of a person's body. The massage effect can be provided manually, or it can be provided mechanically. One such manner of providing the effect mechanically can be provided by placing a vibrator within the housing 17, which can hold a battery (not shown) for powering the vibrator.

Figure 2:
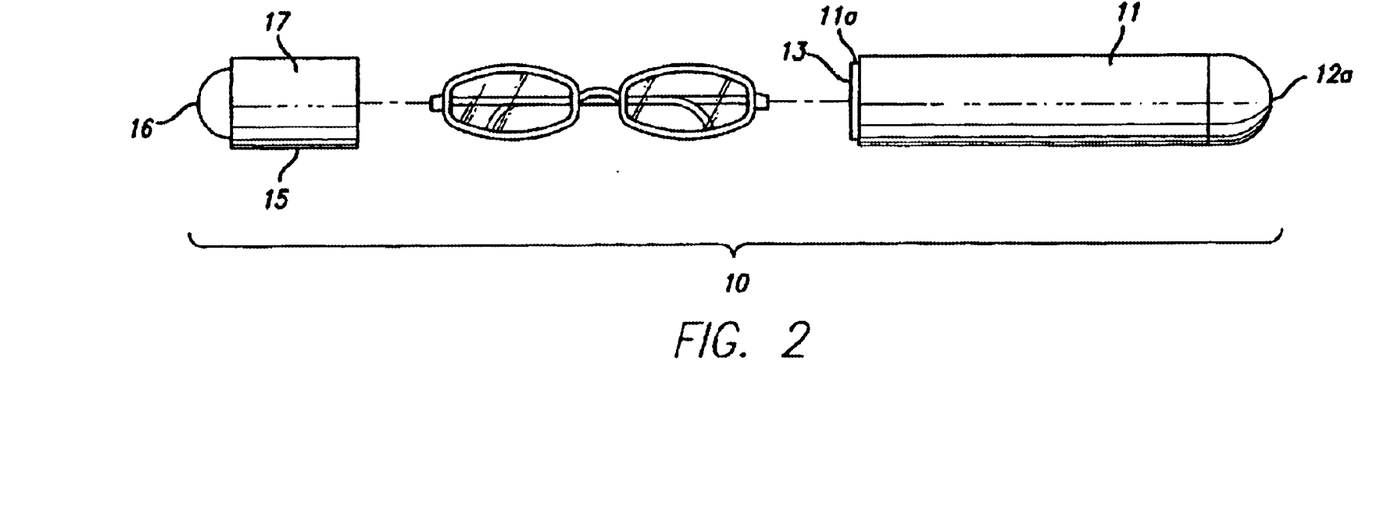
FIGS. 2–6 are side elevational views of additional embodiments of containers provided with a massage elements.
Figure 3:
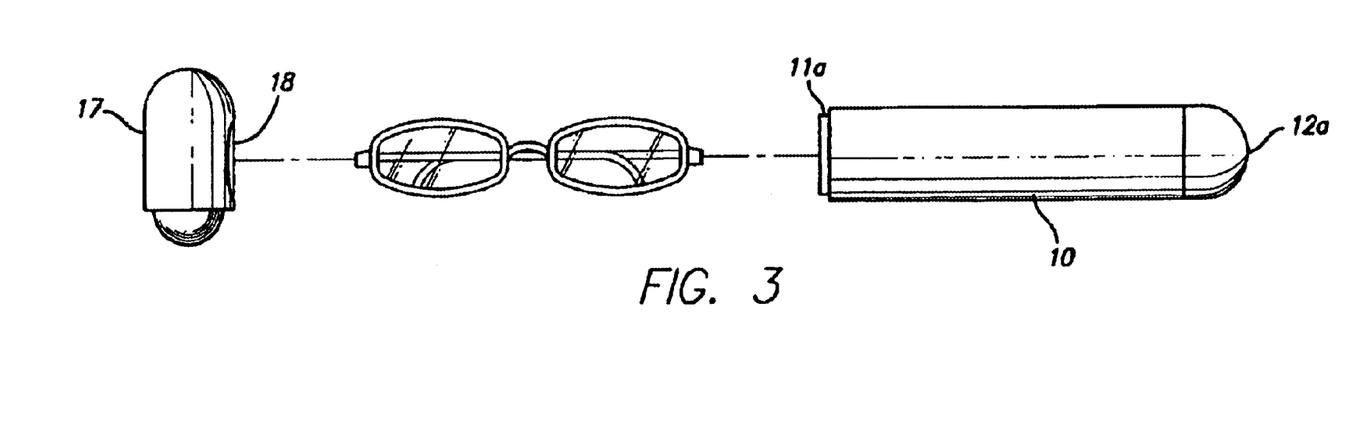
Figure 4:
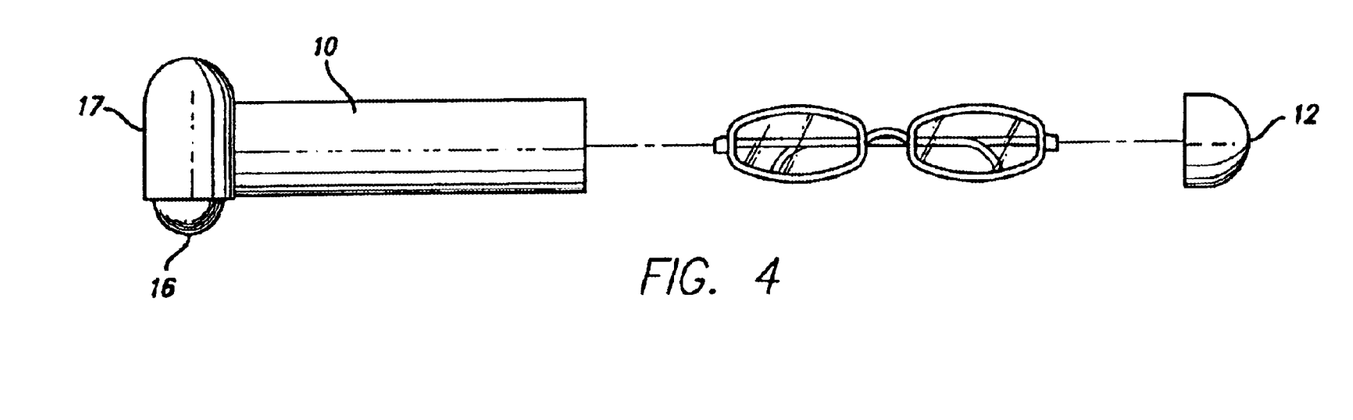

In an alternative embodiment depicted in FIG. 2, the container opens between the housing 15 and body 11. Body 11 can be provided with rim 11a that fits within the interior wall of the housing 15 and forms a frictional fit therewith. In yet a further alternative embodiment shown in FIG. 3, the housing is provided with a recess or opening 18 on one of its sides for receiving the body 11. This positions the massage element perpendicular to the longitudinal axis of the body 11. FIG. 4 shows an embodiment where the opening 13, and cap 12, which seals the opening, is positioned at the end opposite the massage element 15.

Figure 5:
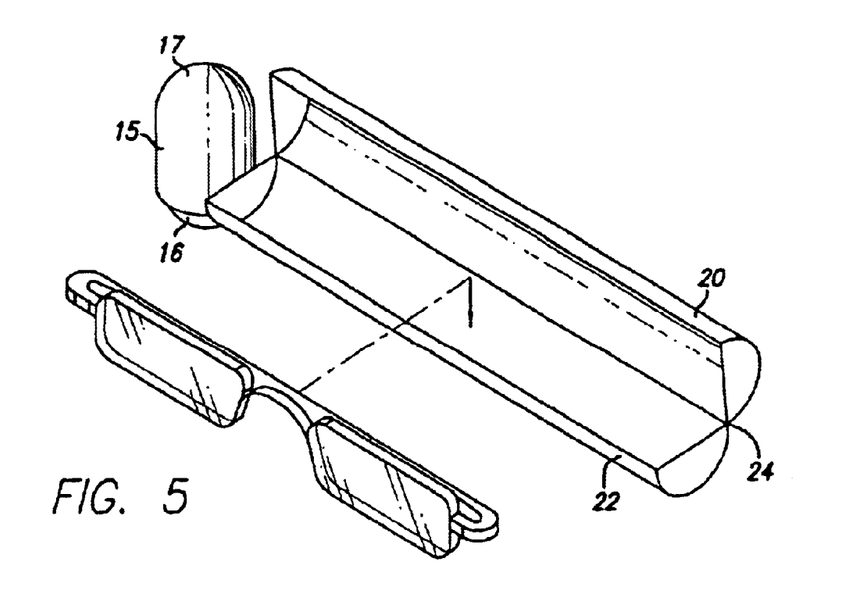
Figure 6:
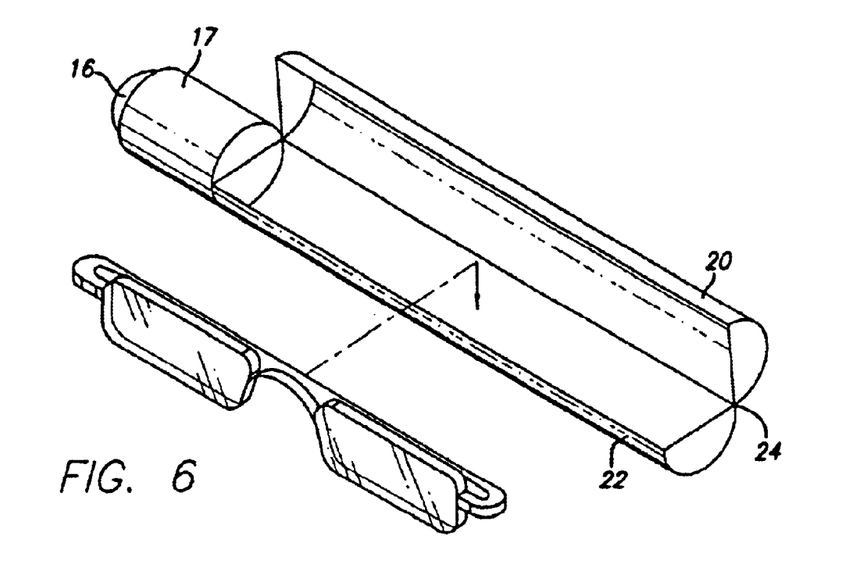

FIG. 5 shows an alternative arrangement in which the massage element 15 is mounted to a clamshell type eyeglass case. The clamshell-type eyeglass case is provided with an upper portion 20, and a lower portion 22 each of which are joined to each other by a hinge 24. FIG. 6 shows a claimshell type arrangement for the case wherein the massage head is parallel to the longitudinal axis of the body.

Figure 7:
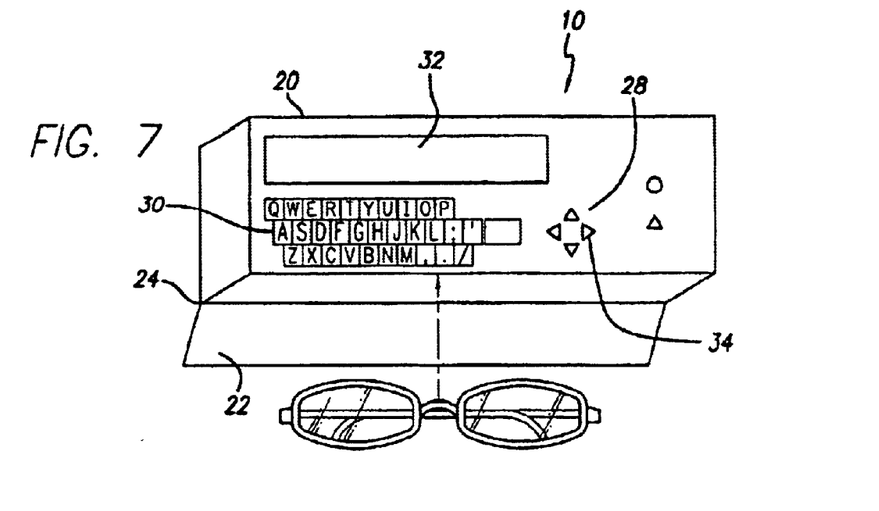
FIG. 7 is a side elevational view of a personal digital assistant (PDA) and container of the present invention.
Figure 8:
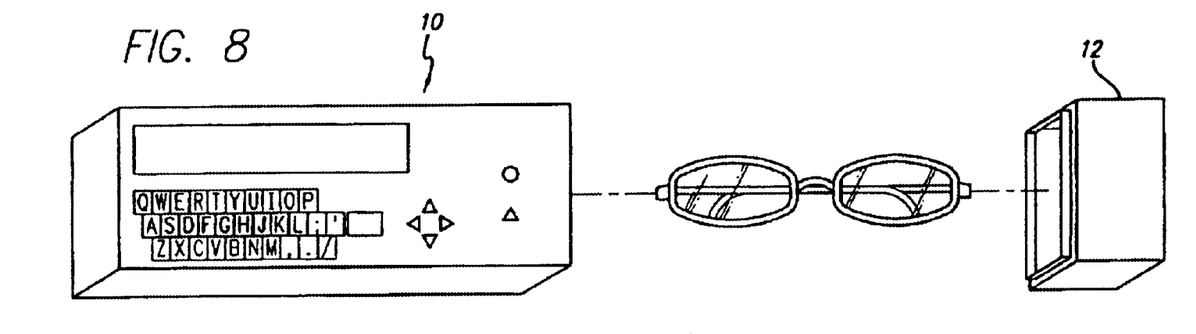
FIG. 8 is a side elevational view of an alternative embodiment of a personal digital assistant and container.

FIG. 7 shows a container for storing eyeglasses having a PDA device (Personal Digital Assistant) 28 located on the container. In the embodiment shown, the container 10 is provided with a portion 22 that is attached to the body 20 by a hinge 24. The PDA is provided with a keyboard 30, display 32, and functionality keys 34. The portion 22 can be opened and closed in order to provide access to the interior of the container. In another arrangement shown in FIG. 8, the container can be provided with an opening in at least one end. A cap or other closure 12 can then be placed over the opening, or removed therefrom, to provide access to the interior of the container.

Figures 9, 10:
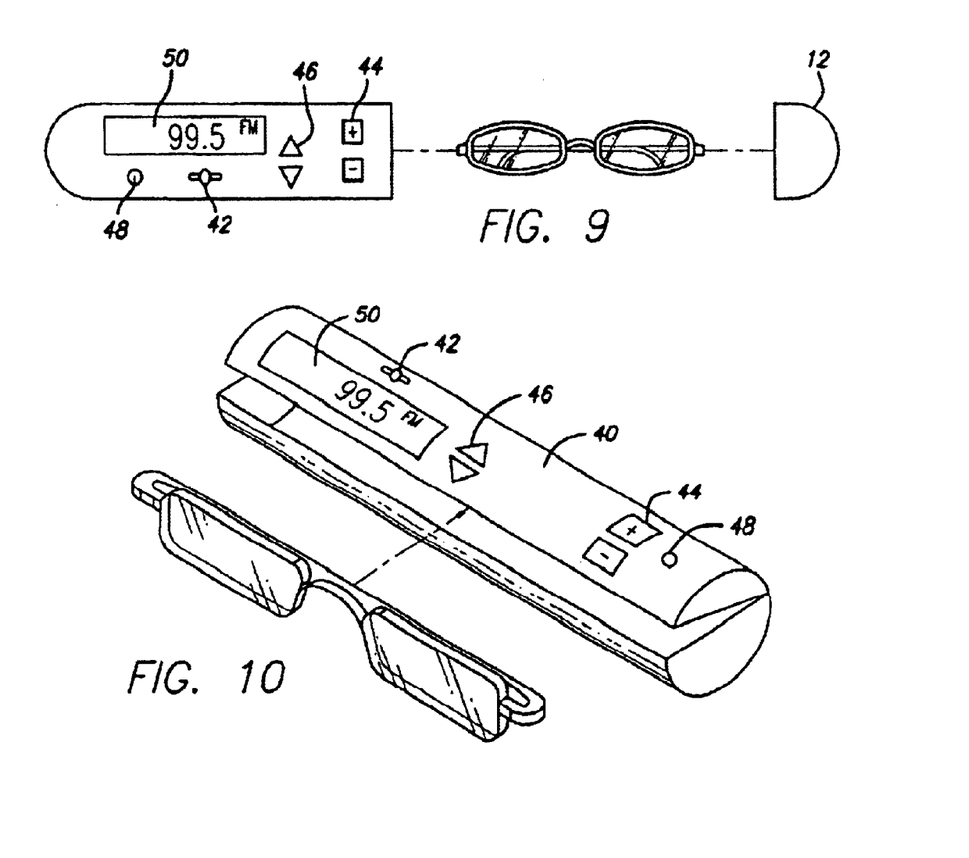
FIG. 9 is a side elevational view of a radio and container of the present invention.
FIG. 10 is a side elevational view of an alternative embodiment of a radio and container of the present invention.

FIG. 9 shows a container on which a radio 40 is positioned on the container 10. The radio is provided with the standard controls: an on-off switch 42, a tuner control 44, a volume control 46, band selection, and a tuner display. FIG. 9 shows the container provided with a container body which has an opening at one end through which the glasses can be inserted and removed from the container. The cap 12 can be placed over the container in order to seal the interior of the container from the outside environment, or, as the case may be, removed to provide access to the interior of the container. FIG. 10 shows a container in a clam-shell arrangement in which a radio is positioned on the container.

Figure 11:
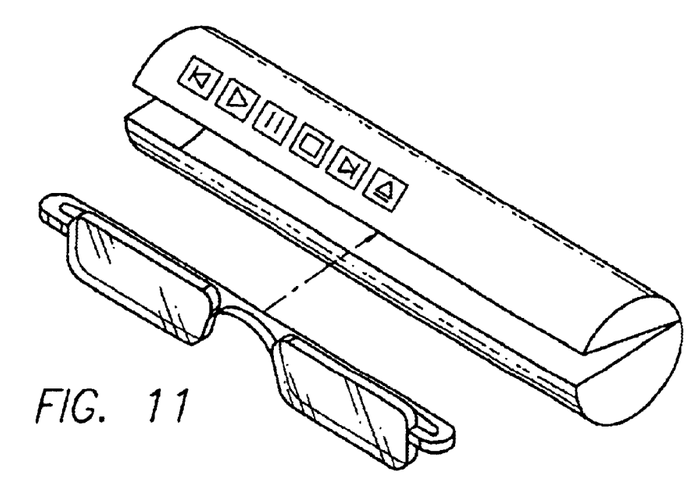
FIG. 11 is a side elevational view of a MP3 device and container of the present invention.
Figure 12:
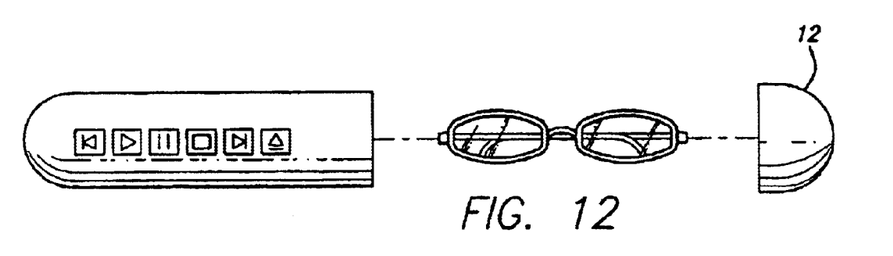
FIG. 12 is a side elevational view of an alternative embodiment of a MP3 device and container of the present invention.

FIG. 11 shows a portable MP3 player in which is positioned on the container 10 is in a clam shell type arrangement. The MP3 player is provided with the conventional controls, including ones that permit track selection, fast forward, rewind, skip forward, skip backward, erase, upload, download, on and off, and volume. The device is also provided with ports that can be used to interface the device to a source from which MP3's can be transferred, either to or from the MP3 device. FIG. 12 shows the container provided with a container body which has an opening at one end through which a the glasses can be inserted and removed from the container. The cap can be placed over the container in order to seal the interior of the container from the outside environment, or, as the case may be, removed to provide access to the interior of the container.

Figure 13:
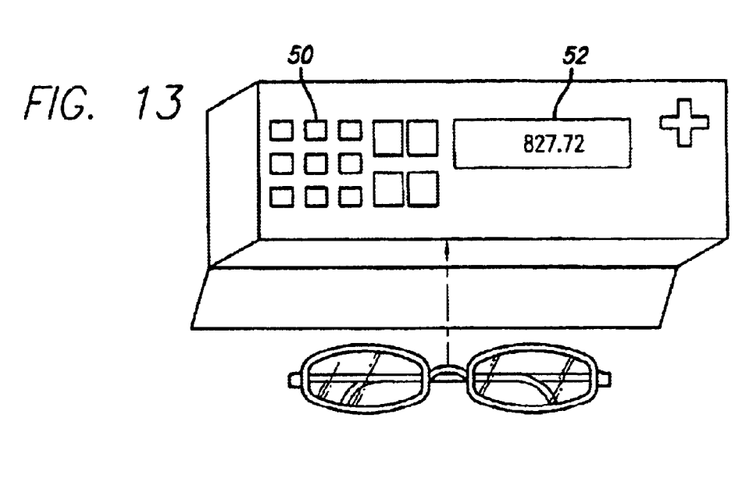
FIG. 13 is a side elevational view of a calculator and container of the present invention.
Figure 14:
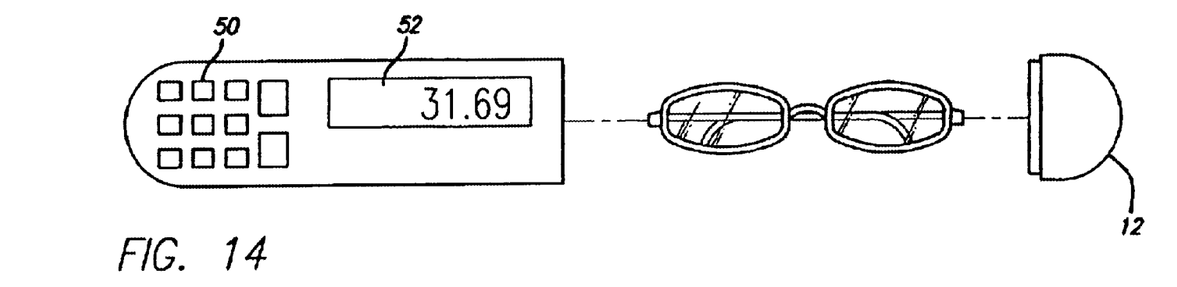
FIG. 14 is a side elevational view of an alternative embodiment of a calculator and container of the present invention.

FIG. 13 shows a calculator which is positioned on the container that is provided with a clam shell type arrangement. The calculator is provided with the conventional controls, including ones that buttons for digits, mathematical functions, clear, and on/off. It is also provided with a numeric display 52. FIG. 14 shows the container provided with a container body which has an opening at one end through which the glasses can be inserted and removed from the container. The cap 12 can be placed over the container in order to seal the interior of the container from the outside environment, or, as the case may be, removed to provide access to the interior of the container.

Figure 15:
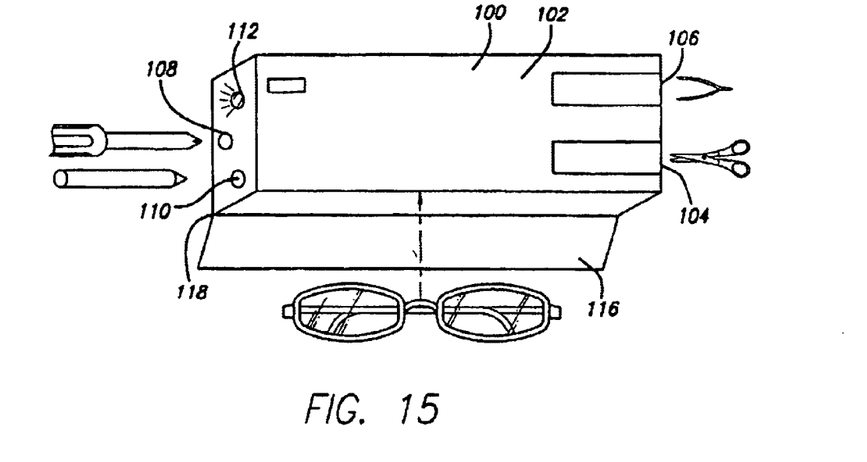
FIG. 15 is a side elevational view of a utility storage device and container of the present invention.
Figure 16:
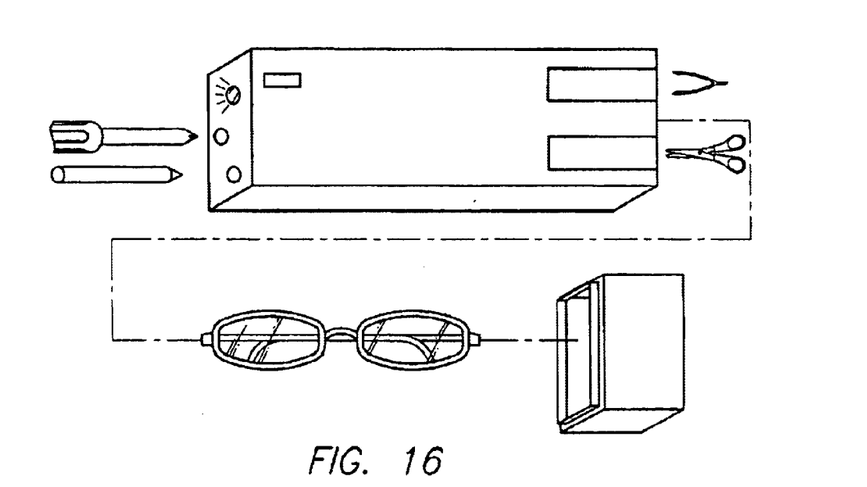
FIG. 16 is a side elevational view of an alternative embodiment of a utility storage device and container of the present invention.

FIG. 15 shows a utility type device 100 which provides a container having a body 102 for storing eyeglasses in an interior portion, and other compartments 104, 106, 108 110, for holding any of a number of useful items, such as scissors, tweezers, a screw driver, and a pen. The container may also be provided with a flashlight 112 having a light source, an on/off switch 114, and a recess for a power supply, such as a battery. A sidewall portion 116 is joined to the body 102 by a hinge 118. The sidewall can be opened and closes along the hinge. FIG. 16 shows an embodiment in which the container is open and closed with a cap as in every other even numbered embodiment.

Figure 17:
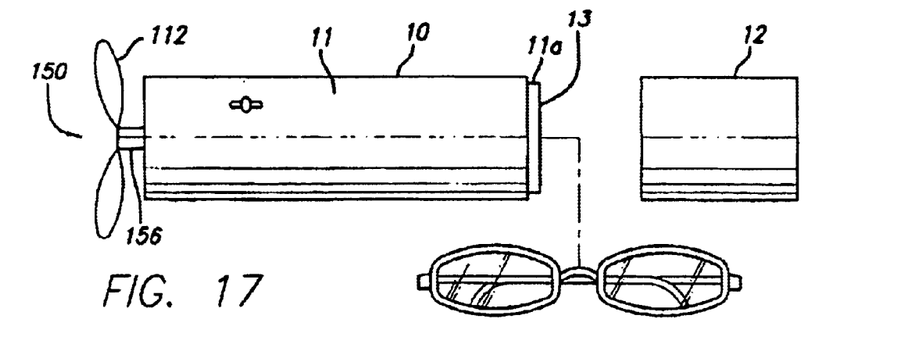
FIG. 17 is a side elevational view of fan and container of the present invention.

FIG. 17 shows a container 10 for storing eyeglasses or other items. The container 10 is provided with a body 11 defining a cavity in which an item such as eyeglasses can be stored. The container is provided with a cap 12 dimensioned to close the opening 13 of the body 11, through which opening 13 the eyeglasses are inserted into the cavity. When the cap 12 is joined to the body 11, the interior space is enclosed. When the cap is removed from the body, the interior space can be accessed, permitting the user to insert or remove the eyeglasses from the space.

The container is further provided with a fan 150 at its other end. The fan 150 has a propeller 152 joined to the body 11 by axial pin 156. The body 11 contains a power source (not shown), such as a battery (not shown), that powers a motor that rotates the axial pin 156. Switch 158 turns the motor on and off.

Figure 18:
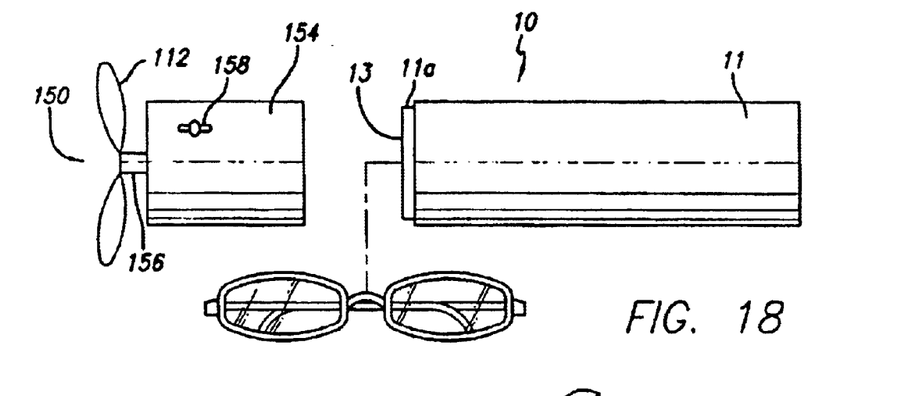
FIG. 18 is a side elevational view of an alternative embodiment of a fan and container of the present invention.
Figure 19:
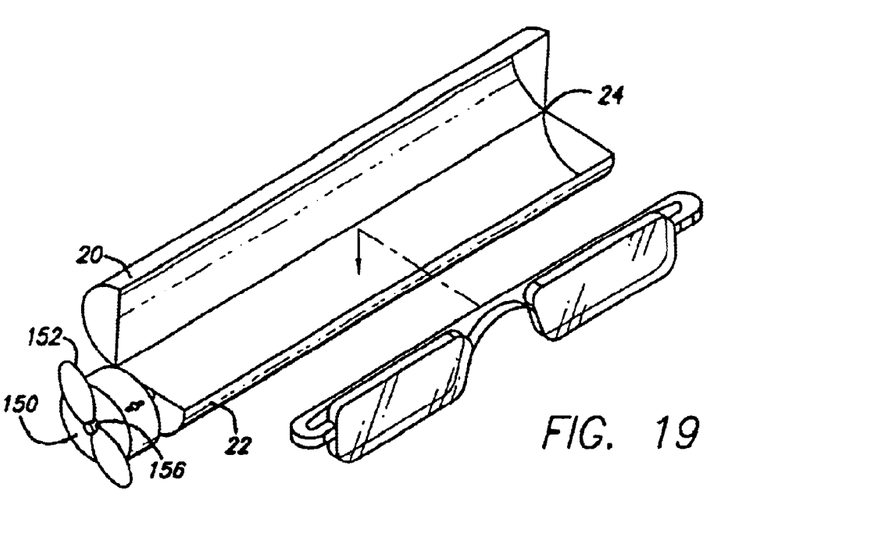
FIG. 19 is a side elevational view of an alternative embodiment of the present invention.

In an alternative embodiment depicted in FIG. 18, the container opens between the housing 154 and body 11. Body 11 can be provided with rim 11a that fits within the interior wall of the housing 154 and forms a frictional fit therewith. FIG. 19 shows an alternative arrangement in which the fan 150 is mounted to a clamshell type eyeglass case. The clamshell-type eyeglass case is provided with an upper portion 20, and a lower portion 22 each of which are joined to each other by a hinge 24.

I claim:

1. A container for storing an item, comprising: wherein the stored item is a pair of eyeglasses in a folded state;

an elongated body defining an elongated interior space for storing the pair of eyeglasses in the folded state; wherein the elongated body has a shape generally corresponding to the shape of the pair of eyeglasses in the folded state and wherein the interior space has a shape generally corresponding to the shape of the pair of eyeglasses in the folded state such that the elongated body and the elongated interior space are of substantially the same shape;

an opening through which the pair of eyeglasses in the folded state can be stored in the elongated interior space of the elongated body and removed therefrom;

a closure element having an open position permitting access to the elongated interior space and a closed position closing the elongated interior space; and a calculator located on the container, which calculator is permanently affixed to and integrated with the container and which calculator has a plurality of buttons and a display which are exposed on an exterior surface of the container;

wherein the opening is closed with the closure element.

2. A container for storing an item, comprising: wherein the stored item is a pair of eyeglasses in a folded state;

an elongated body including a first portion and a second portion;

a hinge, wherein the first portion and the second portion are joined together at the hinge, wherein the first portion and the second portion define an elongated interior space for storing the pair of eyeglasses in the folded state, wherein the first portion and the second portion permit access to the elongated interior space when the first portion and the second portion are in an open state, and wherein the first portion and the second portion close the elongated interior space when the first portion and the second portion are in a closed state; and a calculator located on the container, which calculator is permanently affixed to and integrated with the container and which calculator has a plurality of buttons and a display which are exposed on an exterior surface of the container;

wherein the elongated body has a shape generally corresponding to the shape of the pair of eyeglasses in the folded state and wherein the elongated interior space has a shape generally corresponding to the shape of the pair of eyeglasses in the folded state such that the elongated body and the elongated interior space are of substantially the same shape.

\* \* \* \* \*